United States Patent [19]
Carroll et al.

[11] Patent Number: 5,397,595
[45] Date of Patent: Mar. 14, 1995

[54] METHOD OF DENSIFYING POROUS BILLETS

[75] Inventors: Thomas J. Carroll, Salem, N.H.; Donald F. Connors, Jr., Tewksbury, Mass.; Raymond J. Suplinskas, Haverhill, Mass.; Garrett S. Thurston, Lowell, Mass.

[73] Assignee: Avco Corporation, Providence, R.I.

[21] Appl. No.: 989,153

[22] Filed: Dec. 11, 1992

Related U.S. Application Data

[62] Division of Ser. No. 703,623, May 21, 1991, abandoned.

[51] Int. Cl.⁶ ............................................. B05D 3/02
[52] U.S. Cl. ................................. 427/228; 427/226; 427/229; 427/249; 427/250; 427/255.2; 427/255.7; 427/379; 427/419.1; 427/419.7; 427/420.1; 427/435
[58] Field of Search ............ 427/226, 228, 229, 419.7, 427/435, 430.1, 249, 250, 255.7, 255.2, 379, 419.1

[56] References Cited

U.S. PATENT DOCUMENTS

| | | | |
|---|---|---|---|
| 3,356,525 | 12/1967 | Gutzeit | 427/228 |
| 3,850,689 | 11/1974 | Basche et al. | 117/229 |
| 4,278,729 | 7/1981 | Gibson | 428/367 |
| 4,340,636 | 7/1982 | DeBolt et al. | 428/215 |
| 4,425,407 | 1/1984 | Galasso et al. | 428/368 |
| 4,472,454 | 9/1984 | Houdayer et al. | 427/45.1 |
| 4,472,476 | 9/1984 | Veltri et al. | 428/367 |
| 4,588,799 | 5/1986 | Petersen | 427/228 |
| 4,837,073 | 6/1989 | McAllister et al. | 428/408 |
| 5,024,979 | 6/1991 | Debaig-Valade et al. | 427/228 |
| 5,035,921 | 7/1991 | Berneburg et al. | 427/228 |
| 5,045,356 | 9/1991 | Uemura et al. | 427/249 |
| 5,133,993 | 7/1992 | Streckert et al. | 427/228 |
| 5,238,711 | 8/1993 | Barron et al. | 427/226 |

*Primary Examiner*—Janyce Bell
*Attorney, Agent, or Firm*—Edmund J. Walsh; Mary E. Porter

[57] ABSTRACT

In accordance with the invention there is provided a method of producing a densified carbon preform having interior a porous region of graded carbon-silicon carbide, carbon-silicon nitride or ceramic-ceramic composition.

17 Claims, 4 Drawing Sheets

METHOD OF DENSIFYING POROUS BILLETS

This is a divisional of application Ser. No. 07/703,623, filed on May 21, 1991, now abandoned.

INTRODUCTION

The invention is directed generally to densified porous preforms comprising porous preforms into which a matrix composition, as hereinafter defined, is deposited within the pores of the porous preform.

DEFINITIONS

The term preform shall apply to porous members such as multi-directional woven structures widely known as 2D,3D, 4D, - - - nD structures. Preforms may also be constructed from fabrics, felts or cellular structures.

Billet or Densified Preform shall mean a preform having its pores essentially filled with matrix material forming a composite structure.

A graded matrix composition is defined as a composition in which the percentage of a matrix material across a section of the preform or within the pores of a preform is not uniform. The composition may vary discontinuously or continuously.

A graded carbon-ceramic composition is defined as a matrix composition in which the percentage of ceramic relative to carbon increases from zero on a substrate toward 100% remote from the substrate. The term, for example, may also apply to a matrix composition where the ratio of carbon to ceramic to carbon is zero in an interior region of a billet and increases toward 100% at the exterior surface of the billet.

Fast or Rapid Densification is the process described and claimed in U.S. Pat. No. 4,472,454, or a variation thereof.

Substrate surfaces of a preform are the structural members such as fibers or cellular walls defining the pores of the preform.

GENERAL INFORMATION

The process may be applied to any porous preform which can be heated sufficiently to effect chemical vapor deposition of a matrix material on a substrate surface.

Generally, also the process lends itself to varying the composition of a matrix within the pores of a preform in a continuous deposition process.

The process also lends itself particularly to forming graded matrices of selected materials for a variety of purposes e.g. oxidation protection, thermal shock and impact resistance etc.

The invention has timely application to oxidation protected carbon preforms and particularly carbon preforms using ceramic compositions to improve the resistance of the carbon to oxidation. For this reason the invention will be described in the context of depositing a graded carbon-ceramic matrix within a carbon, specifically a 3D carbon preform. A broader selection of matrices will be covered later.

Carbon-carbon composites (C/C) comprising carbon fibers in a carbon matrix exhibit many desirable properties for high temperature application. C/Cs are strong, tough, lightweight, highly refractory materials with unequalled strength retention and creep resistance to very high temperatures. C/C's combination of relatively low elastic modulus, extremely low coefficient of thermal expansion, and high thermal conductivity results in a material that exhibits exceptional thermal shock resistance.

Carbon-carbon composites require oxidation protection for many applications at high temperatures. It is generally recognized that dense ceramic coatings of silicon carbide (SiC) and silicon nitride ($Si_3N_4$) as part of an oxidation protection strategy offer a potential for useful performance. (J. E. Sheehan, Carbon 27, 709 (1989)). The most serious problem in the use of such coatings is the thermal expansion mismatch between the composite and the ceramic coating which causes cracks in the coating and spallation.

Use of C/C has been restricted, for the most part, to relatively short duration rocket propulsion, e.g. ITE's (integral throat entrances), or reentry applications, e.g. nose cones, due to its inherently poor oxidation resistance.

Early reports laying out the basis for much of the subsequent work, were concerned with properties of basic interest for development of an oxidation resistant coating. These reports were interested with aspects such as diffusion of species through protective coatings, volatility of protective coatings, and chemical and mechanical compatibility of the coating materials with graphite. Also included were methods for applying coatings such as: 1) chemical vapor deposition(CVD), 2) Flame spraying, 3) Slurry dipping, painting or troweling, or 4) electrophoretic deposition.

Recent work cited in U.S. Pat. Nos. 4,582,751, 4,599,256, 4,472,476, 4,585,675 on oxidation resistant C/C's have utilized innovative methods of coating or inhibiting oxidation of C/C's. The new methods are similar to the previous methods. However the coating or inhibitors were produced using unique combinations of materials and processes. In some cases the materials of concern arose out of the reduction to practice of previously proposed materials.

The application of silicon- or silicate ceramics-based coatings provide only limited oxidation resistance as cracks develop in the coating or the coatings peel off. Oxygen and atmospheric moisture passes though the cracks to the underlying material with deleterious or disastrous effect.

Silicon nitride and silicon carbide ceramic deposits made by chemical vapor infiltration and other methods require hours to make and have undesirable byproducts and are generally made in a vacuum.

The aforementioned procedures exhibit thermal shock problems due to the inherent differences particularly in the coefficient of thermal expansion between the carbon and the ceramic coating.

A raison d'etre of ceramic-ceramic composites is to provide the toughness and damage tolerance unavailable in monolithic ceramics. As currently understood, the key to achieving these properties is the proper interaction of the preform and the matrix at their interface. If bonding across this interface is strong, toughness is not achieved because cracks propagate readily through the interfaces resulting in catastrophic failure. If the bonding is too weak optimum mechanical properties may not be achieved and toughness may be diminished by too facile fiber pull out.

The process described in the application could also be used to tailor the inter-facial properties through graded chemical composition with the object of optimizing the fiber matrix bond. Past approaches have included fiber coating prior to preform fabrication or chemical vapor infiltration of woven preforms. These prior approaches suffer from mismatch of dissimilar material properties and very long process times.

OBJECTS OF THE INVENTION

It is an object of the invention to provide a densified preform and a process for making such a preform which avoids the limitations and disadvantages of prior art densified billets.

It is another object of the invention to provide a densified preform or billet containing a chemical vapor deposited matrix and a process for making such a densified preform, or billet.

It is another object of the invention to provide a densified preform and process for densifying a preform with a graded matrix composition.

It is yet another object of the invention to provide a densified preform having a continuously varying matrix composition.

It is yet another object of the invention to provide a process for making a continuously varying or a discontinuous graded matrix composition.

It is still another object of the invention to provide a graded matrix for inhibiting the oxidation of carbon preforms.

It is yet another object of the invention to provide an oxidation resistant carbon billet containing a graded ceramic matrix, e.g. SiC, $Si_3N_4$, $B_4C$, BN etc.

It is also an object of the invention to provide a process for making an oxidation resistant carbon billet containing a graded carbon-ceramic matrix.

It is also an object of the invention to provide a process for optimizing the interfacial properties between the fibers and the matrix.

STATEMENT OF THE INVENTION

In accordance with the invention there is provided a densified preform comprising a preform having an interior porous region bounded by exterior surfaces. The pores of the preform contain a graded vapor- deposited matrix composition.

Also in accordance with the invention there is provided a densified carbon preform comprising a porous carbon preform having an interior porous region bounded by exterior surfaces. The interior porous region contains a graded composition. The graded composition may be a carbon-silicon carbide, a carbon-silicon nitride, carbon-ceramic, or ceramic-ceramic composition.

In another embodiment of the invention there is provided an oxidation inhibited carbon billet having a porous carbon preform with exterior surfaces and a porous interior structure. The pores contain a graded carbon ceramic composition. The exterior surfaces of the carbon preform are coated with ceramic. The preferred ceramics are silicon carbide and silicon nitride, or mixtures thereof.

Another embodiment of the invention comprises processes for densifying a porous preform by depositing a continuously varying or discontinuous graded composition within the interior region of the preform or within the pores.

BRIEF DESCRIPTION OF THE DRAWINGS

The novel features that are considered characteristic of the invention itself, however, both as to its organization and method of operation, together with additional objects and advantages thereof, will best be understood from the following description of a specific embodiment, when read in conjunction with the accompanying drawings, in which.

DESCRIPTION OF THE INVENTION

The preferred embodiment described in detail herein addresses the problem of providing thermal expansion compatibility between a carbon preform and an oxidation inhibited densified preform. Both thermal expansion compatibility and oxidation inhibition may be accomplished through grading the matrix composition to include a ceramic component.

The process of constructing a discontinuous graded matrix within the preform 30 will be described in relation to FIGS. 1-3.

Figure 1:
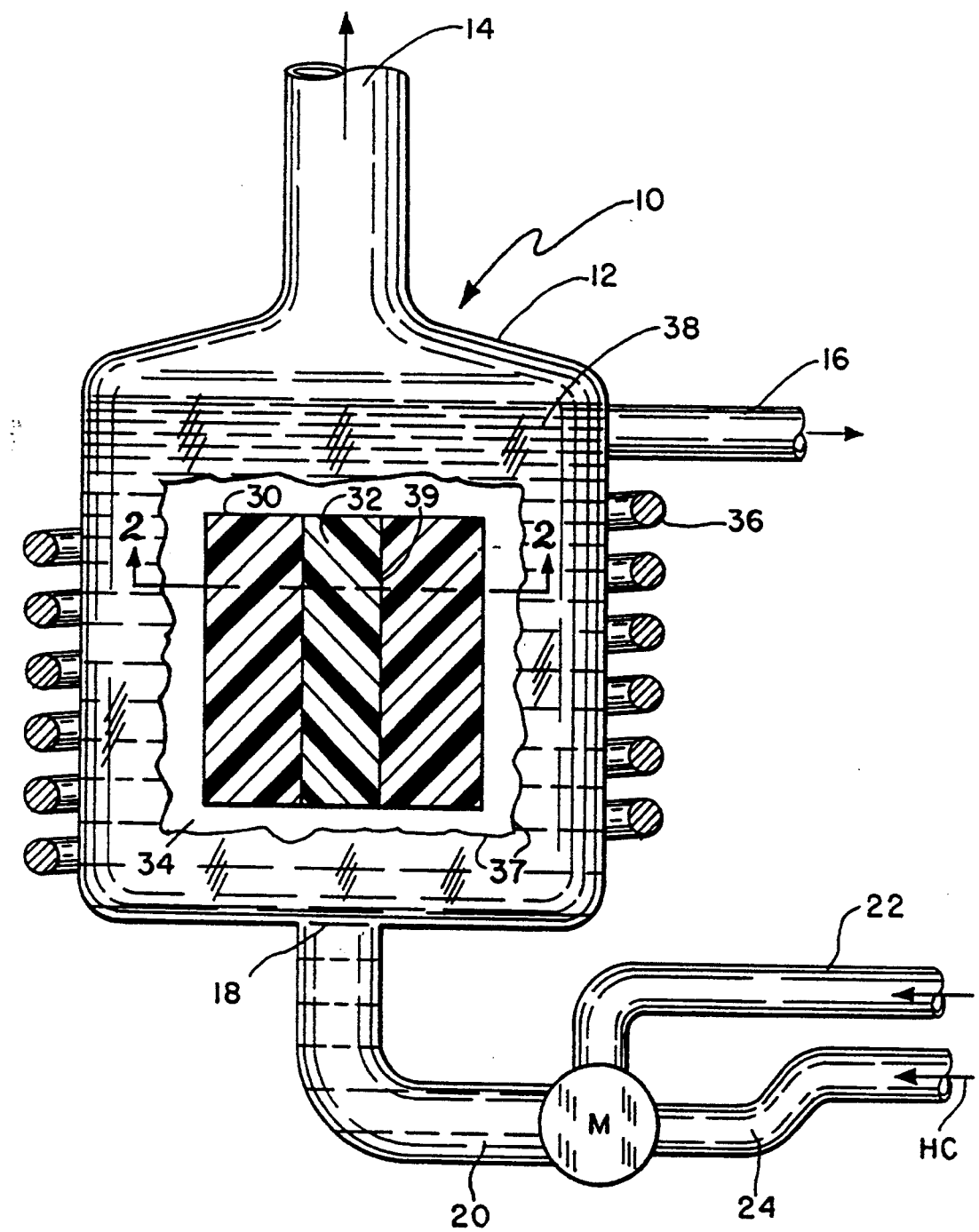
FIG. 1 is a schematic representation of an induction heated reactor for making densified preforms in accordance with the invention.

Referring to FIG. 1 there is shown a schematic representation of a reactor 10 useful for making he densified porous preform in accordance with the invention. The reactor 10 contain a vessel 12 which includes a exhaust port 14, an outlet port 16, and an inlet port 18. Connected to the inlet port 18 is a conduit 20 which communicates through a mixer valve M, two reagent inlets 22 and 24. A preferred reagent in the process for making as carbon -ceramic graded matrix is a liquid hydrocarbon such a cyclohexane from which carbon can be vapor deposited.

Positioned within the reactor 12 is a densified preform 30 which is to be densified in accordance with the invention. In this instance, the preform 30 contains a heat susceptor 32. The susceptor 32. in this illustration is used to concentrate heat in the center of the preform 30 to initiate radial heat transfer through the preform 30.

In many cases the susceptor will not be required. This is particularly true where the density of the porous preform is relatively high and where induction heating can be effective without a susceptor.

The fast or rapid densification/CVD process wherein a carbon preform is immersed in cyclohexane and heated to at least the decomposition temperature of the cyclohexane is described in U.S. Pat. No. 4,472,454, which is hereby incorporated by reference. In the patented process carbon is deposited in the walls of the pores and within the pores of the preform producing a carbon-carbon billet.

In the embodiment where the purpose is to deposit a graded matrix within the interior of the preform, carbon will be deposited adjacent to the inside surface of the cylindrical preform 30. The densification will proceed generally outwardly radially. As the densification proceeds outwardly toward the exterior surface of the preform 30 the proportion of carbon deposited will be decreased while the percentage of ceramic deposited is increased.

The graded portion of the deposit is obtained by controlling the liquid stoichiometry. Initially the deposit is pure carbon or very carbon rich and then proceeds toward stoichiometric ceramic remote from the substate surface. The actual temperature distribution varies as a function of both the deposit time and the spatial coordinates due to the progression of the deposit front and the heat of vaporization of the mixture respectively.

To densify the preform 30 in FIG. 1 a hydrocarbon such as cyclohexane 38 is introduced via inlet 24, mixer M and inlet 18 until the cyclohexane covers and impregnates the preform 30. Excess reagent leaves the vessel 12 through outlet 16.

An induction heater 36 is provided to heat, initially the susceptor 32 until the region adjacent to the inside surface 39 of preform 30 is heated above the decomposition temperature of the cyclohexane. The preferred decomposition range for depositing and coating is 1000° C. to 1500° C., nominally 1200° to 1300° C. Carbon is deposited on the substrate surfaces defining the pores adjacent to the inside surface 39. The hydrogen released is exhausted through the exhaust 14. See layer 41 in FIG. 2 and the graph in FIG. 3.

Figure 2:
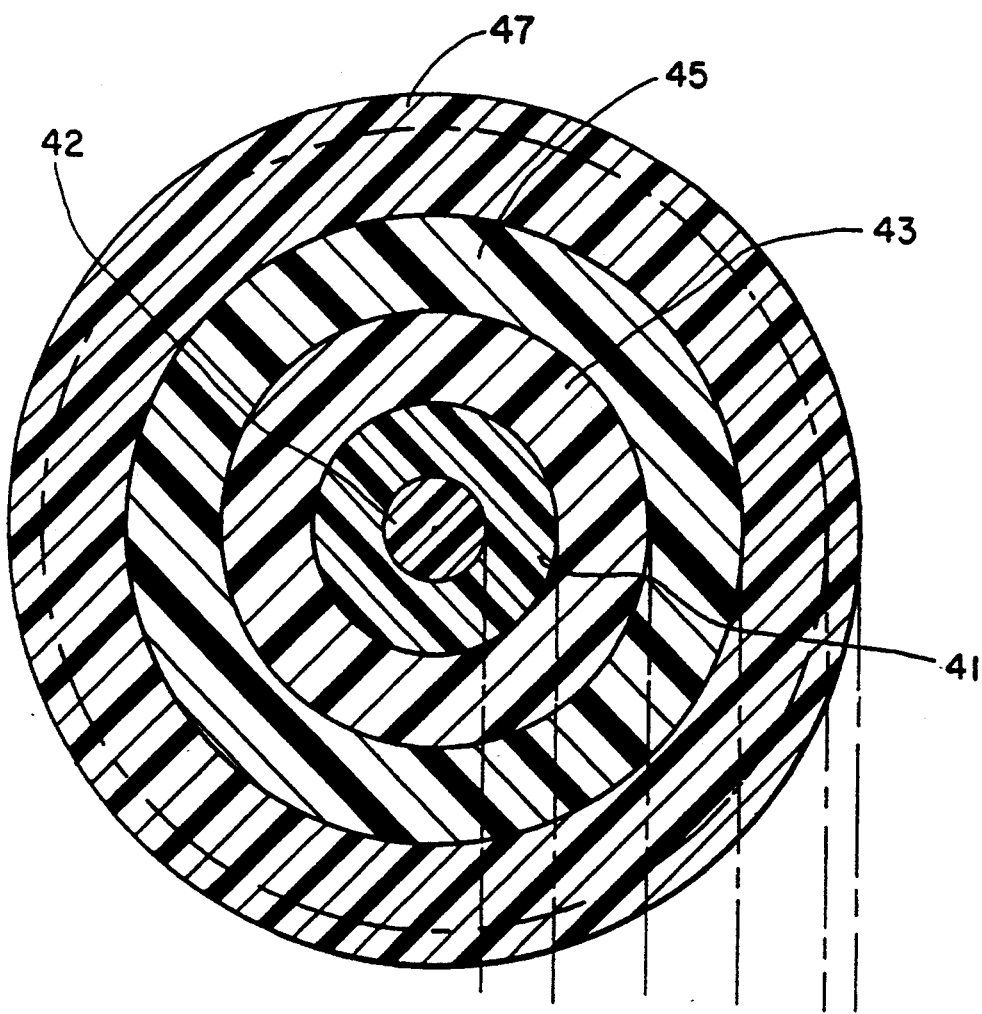
FIG. 2 is a cross section of the billet formed from the preform of FIG. 1 taken along line 2—2.
Figure 3:
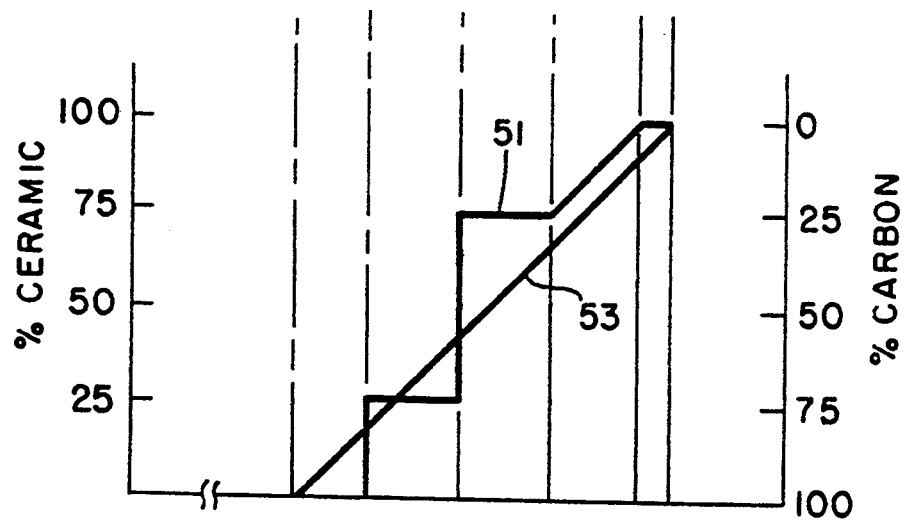
FIG. 3 is a graphic representation of the graded carbon-ceramic composition within the billet.

Referring to FIGS. 2-3 the foregoing process steps create a layer 41 comprising 100% carbon and zero % ceramic.

To construct a discontinuous graded carbon-silicon carbide matrix within the interior of the preform as illustrated in FIG. 2 a silicon carbide precursor such as a chlorsilane, e.g. methyltrichlorsilane, is supplied to inlet 22 (FIG. 1) until a desired mixture of carbon and silicon carbide precursors is achieved. The time-temperature is adjusted within the preferred range to cause the deposition front to progress outwardly until layer 43 is formed.

Subsequently the liquid stoichiometry is adjusted again so that the layer 45 comprising 75% silicon carbide and 25% carbon is formed. Finally, the liquid stoichiometry is adjusted to 100% chlorosilane and 100% silicon carbide is deposited adjacent to the exterior surface of the preform 30 and on the exterior surfaces 37 of the preform 30.

See curve 51 in FIG. 3 for a graphic representation of the just described graded matrix structure.

Alternatively the stoichiometry could have been varied continuously to provide a continuous variation shown in curve 53 of FIG. 3.

Referring to FIG. 1 there is depicted an irregular aura like line surrounding the preform 30. This is a stable vapor film 34 which is created by the decomposition of the liquid and precursor vaporization processes. The film acts to cool the preform in front of the deposition front so that no deposition takes place in front of the deposition front. The formation of the film is also characteristic of the use of liquid to immerse the preform.

Because a liquid is used and because liquids characteristically form vapor films, it possible to create a large temperature gradient across the preform. It is possible to effect rapid densification.

Figure 4:
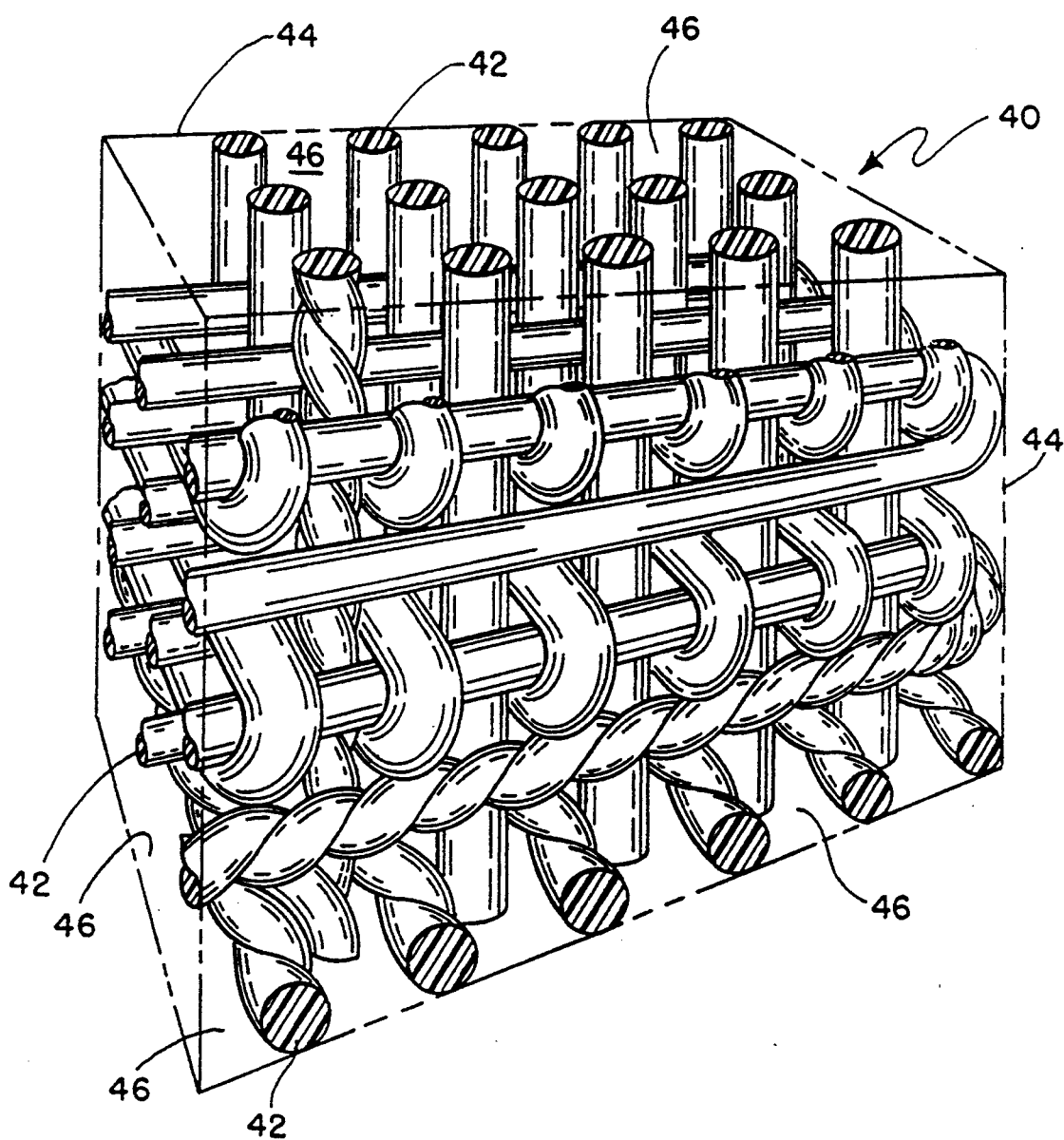
FIG. 4 is a representation of a 3D porous woven preform containing a graded ceramic matrix composition within its pores.
Figure 5:
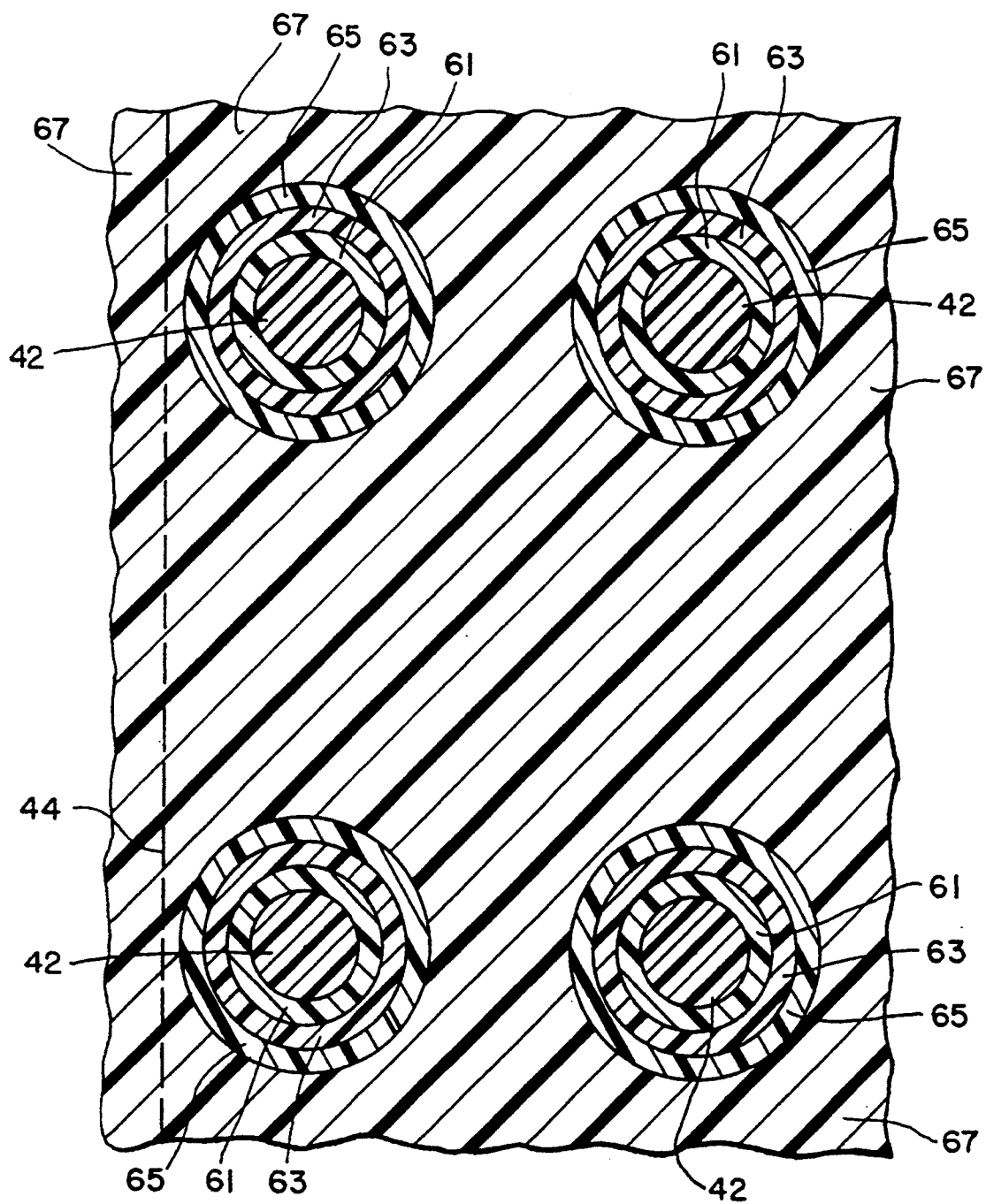
FIG. 5 is a schematic representation of the fiber -ceramic distribution about several of the fibers of the FIG. 4 billet.

FIGS. 4-5 are used to illustrate another embodiment where a graded carbon-ceramic composition is deposited within the pores of a preform.

FIG. 4 depicts a 3D woven preform 40. The fibers may be carbon, silicon carbide, or another material which is capable of being heated, preferably by induction. In the case of a carbon 3D preform a susceptor is not needed and is therefore not illustrated. Carbon-ceramics deposits have been described because of the current interest in oxidation inhibited carbon. It must be emphasized that the invention is not limited to carbon-ceramic. Other possible configurations will be set forth below.

Typically, a 3D block structure such as illustrated in FIG. 4 is formed by weaving three mutually orthogonal courses of fibers, such as fibers 42. The symbol 44 is intended to identify "virtual" exterior surfaces of the preform 40. That is, these would be the surfaces if the preform were a solid block. The pores of the preform are identified by the symbol 46. Clearly the pores 46 are the voids between adjacent fibers. The surfaces of the fibers defining these voids are also the substrates on which graded matrices will be deposited.

The object here is to heat the preform uniformly so that deposition will take place on all of the substrate surfaces defining the pores of the preform at substantially the same time.

The sequence of steps needed to construct a graded matrix composition within the pores are essentially the same as previously described. The stoichiometry of the deposit is controlled by stoichiometry of the liquids. The actual deposition temperature is a function of both the deposit time and the location of the deposit front as well as the heat of vaporization, as before.

Initially, for example, the preform is immersed in an organic solvent such as cyclohexane—or for that matter benzene, hexane etc. The fibers from which the preform is constructed are heated uniformly to the decomposition temperature of the cyclohexane. As a result a carbon layer 61 deposited on each fiber. See FIG. 5. The liquid stoichiometry is changed to increase the chlorosilane to increase the percentage of silicon carbide deposited. Consequently, layer 63 is formed. Layer 65 with still more silicon carbide follows. Finally, the liquid contains only the silicon carbide precursor and 100% silicon carbide is achieved in layer 67. Layer 67 is shown to extend beyond the exterior surface 44 of the carbon preform.

Clearly if the stoichiometry of the liquids is varied in a continuous fashion a continuously varying gradation such as shown in curve 53 in FIG. 3 would result.

Deposit compositions could be varied by changing the precursor material. For example deposition of titanium, zirconium, or hafnium carbide may be accomplished from dispersions of titanium, zirconium, or hafnium tetrachloride and cyclohexanes. Other systems could include organo metallics such as titanocene, zincocene, hafnocene in Toluene. Other possibilities would be boron carbide from boron trichloride and an organic compound. Ceramic nitrides could be deposited by reaction of one of the chlorides with hydrazine.

An important ceramic is Silicon Nitride which may be formed by bubbling ammonia ($NH_3$) through such liquid precursors as silicon chloride. Silicon nitride is stable at high temperatures and has a smaller coefficient of expansion than silicon carbide.

TiN would conceivably result from bubbling ammonia through titanium tetrachloride liquid.

Clearly, it is possible by means of the inventive process to form matrices from mixtures of ceramics as well as carbon-ceramic compositions.

The mode of heating the carbon preform will vary with the configuration and the material. For example the preform 30 in FIG. 1 could have been heated by passing current through the carbon. Induction heating may also include r-f and microwave heating where applicable.

The various features and advantages of the invention are thought to be clear from the foregoing description. Various other features and advantages not specifically enumerated will undoubtedly occur to those versed in the art, as will many variations and modifications of the preferred embodiment illustrated, all of which may be achieved without departing from the spirit and scope of the invention as defined by the claims.

We claim:

1. A continuous chemical vapor deposition process for the densification of a porous preform structure comprising a porous substrate body having voids extending inwardly from the surfaces thereof which render said body porous, comprising the steps of:
   (a) providing a reaction vessel for carbon-precursor liquid(s) which are heat-decomposable at elevated temperatures to vapor-deposit coatings on the surfaces of said substrate body to fill said voids and densify said preform structure;
   (b) supplying said reaction vessel with a first said coating-precursor liquid which is heat-decomposable to vapor-deposit a carbon coating on the surfaces of said porous substrate body;
   (c) inserting a said porous substrate body within said reaction vessel to submerge said body in said liquid;
   (d) heating the fibrous porous substrate body submerged within the carbon-precursor liquid to an elevated temperature sufficient to decompose the precursor liquid and cause the vapor deposition of a carbon layer on the surfaces of said substrate body, and
   (e) continuing said heating while the preform is submerged in said liquid to cause the vapor deposit to accumulate on said porous substrate body, as a carbon layer;
   (f) replacing the first liquid within said reaction vessel with a second coating-precursor liquid which is heat-decomposable at elevated temperatures to a vapor and deposits a ceramic or organometallic layer over the carbon layer on said porous substrate body;
   (g) heating the carbon-coated porous substrate body submerged within the second coating-precursor liquid to an elevated temperature sufficient to decompose said precursor liquid and cause the vapor deposition of a ceramic or organometallic layer over the carbon layer on the surfaces of said substrate body, and
   (h) continuing said heating while the substrate body remains submerged in said second coating—precursor liquid to cause the vapor deposit to accumulate on said body, fill said voids and form a densified preform structure enclosed within said ceramic or organometallic material.

2. A process as defined in claim 1 in which said porous substrate body comprises a fibrous body in which the voids comprise the open spaces between the fibers thereof.

3. A process as defined in claim 1 which comprises replacing the first precursor liquid with the second precursor liquid in step (f) by gradually diluting the first liquid with the second liquid to co-deposit in step (g) diminishing amounts of carbon and increasing amounts of the ceramic or organometallic material.

4. A process as defined in claim 1 which comprises replacing the first precursor liquid with the second precursor liquid in step (f) in increments to co-deposit in step (g) layer strata containing different ratios of carbon and ceramic or organometallic material.

5. A process as defined in claim 1 in which said first precursor liquid comprises cyclohexane.

6. A process as defined in claim 1 in which said second precursor liquid comprises a precursor of a ceramic carbide or nitride.

7. A process as defined in claim 6 in which the precursor is a silicon carbide precursor comprising a chlorosilane.

8. A process as defined in claim 7 in which the chlorosilance comprises methyltrichlorsilane.

9. A process as defined in claim 1 in which the second precursor liquid comprises an organometallic compound.

10. Process according to claim 1 in which said first coating precursor liquid comprises an organic liquid selected from the group consisting of cyclohexane, benzene and hexane which heat-decomposes to vapor-deposit a base layer of carbon on the surfaces of said porous body.

11. A continuous chemical vapor deposition process for the densification of a porous preform structure comprising a porous substrate having voids extending inwardly from the surfaces thereof which render said body porous, comprising the steps of:
    (a) providing a reaction vessel for coating-precursor liquid(s) which are heat-decomposable at elevated temperatures to vapor-deposit coatings on the surfaces of said substrate body to fill said voids and densify said preform structure;
    (b) filling said reaction vessel with a coating-precursor liquid which is heat-decomposable to a vapor and deposits a ceramic or organometallic layer on the surfaces of said porous substrate body;
    (c) inserting a said porous substrate body within said reaction vessel to submerge said body in said liquid;
    (d) heating the porous substrate body submerged within the coating precursor liquid to an elevated temperature sufficient to decompose the precursor liquid and cause the vapor deposition of a ceramic or organometallic coating on the surfaces of said substrate body, and
    (e) continuing said heating while the preform is submerged in said liquid to cause the vapor deposit to accumulate on said substrate body, fill said voids and form a densified preform structure enclosed within said ceramic or organometallic material.

12. A process as defined in claim 11 in which said porous substrate body comprises a fibrous body in which the voids comprise the open spaces between the fibers thereof.

13. A process as defined in claim 12 in which said fibers comprise carbon fibers.

14. A process as defined in claim 11 in which said coating precursor liquid comprises a precursor of a ceramic carbide or nitride.

15. A process as defined in claim 11 in which the precursor is a silicon carbide precursor comprising a chlorosilane.

16. A process as defined in claim 15 in which the chlorosilane comprises methyltrichlorsilane.

17. A process as defined in claim 11 in which said coating precursor liquid comprises an organometallic compound.

* * * * *